(12) United States Patent
Herbert (10) Patent No.: US 7,394,135 B1
(45) Date of Patent: Jul. 1, 2008

(54) DUAL SOURCE MOSFET FOR LOW INDUCTANCE SYNCHRONOUS RECTIFIER

(76) Inventor: Edward Herbert, 1 Dyer Cemetery Rd, Canton, CT (US) 06019-2029

(*) Notice: Subject to any disclaimer, the term of this patent is extended or adjusted under 35 U.S.C. 154(b) by 302 days.

(21) Appl. No.: 10/905,668

(22) Filed: Jan. 14, 2005

Related U.S. Application Data (60) Provisional application No. 60/481,895, filed on Jan. 14, 2004.

(51) Int. Cl.
*H01L 29/76* (2006.01)
*H01L 29/94* (2006.01)
*H01L 31/062* (2006.01)
*H01L 31/113* (2006.01)
*H01L 31/119* (2006.01)

(52) U.S. Cl. .............. 257/368; 257/288; 257/E21.177; 257/E27.099

(58) Field of Classification Search .............. 257/368, 257/69, 204, 288, 341, 350, 401, E21.177, 257/E27.099, E29.027, E29.13, E29.265
See application file for complete search history.

(56) References Cited

U.S. PATENT DOCUMENTS 6,803,824 B2 * 10/2004 Rategh et al. ............... 330/302

* cited by examiner

*Primary Examiner*—Theresa T. Doan
*Assistant Examiner*—Dilinh Nguyen (57) ABSTRACT

A dual source MOSFET comprises a large number of cells diffused into a substrate. The cells are divided into two regions with separate sources and gates but having a common drain connection, the substrate. It is preferred that the source regions be highly interdigitated so that the current at the silicon to metal interface is sufficiently diffuse so that the source from which it originated is indistinguishable, and in switching from one source to the other causes no significant difference in the current density or distribution at the drain connection, provided that the sum of the source currents is constant. The same construction provides a superior ac switch, though no drain connection is needed.

3 Claims, 8 Drawing Sheets

Prior art

Section A-A

Fig. 17

DUAL SOURCE MOSFET FOR LOW INDUCTANCE SYNCHRONOUS RECTIFIER

CROSS REFERENCE TO RELATED APPLICATIONS

This application is a continuation in part application of a provisional patent application Ser. No. 60/481,895 entitled "Dual Source Metal Oxide Silicon Field Effect Transistor" and filed Jan. 14, 2004. Priority to that date is claimed. This application is incorporated herein by reference.

BACKGROUND OF THE INVENTION

This invention relates to MOSFETs (Metal Oxide Silicon Field Effect Transistors), and in particular to MOSFETs used in synchronous rectifier applications having very high currents and low voltages. In as much as the stored energy in an inductance increases as the square of the current, and in as much as the rate that current can change (di/dt) decreases in an inductance as the voltage is reduced, it is particularly important to minimize the parasitic inductance in low voltage, high current circuits such as synchronous rectifier circuits used for processor power supplies and the like.

Package inductance, and the inductance in the circuit board and other connections to MOSFETs are critical in low voltage, high current synchronous rectifiers. Some new MOSFET packages have very low inductance, yet even that low inductance will be too much as transformer frequencies increase to the megahertz range. In circuits with high di/dt, high frequency effects, especially the skin effect (penetration depth) are serious problems.

Many synchronous rectifier circuits use a pair of MOSFETs connected in a common source configuration. This configuration necessarily means that the drains of the MOSFETs must be separate and connected to the transformer (or other circuits) separately.

SUMMARY OF THE INVENTION

A dual source, common drain MOSFET is more easily made as an integrated structure using present MOSFET manufacturing methods than would be common source, dual drain MOSFET. A typical MOSFET comprises a very large number of MOSFET cells diffused into a silicon die, with the substrate of the die comprising a common drain connection. The cells of the MOSFET comprise separate small MOSFETs, perhaps millions of them, each with a source and a gate. In theory, each cell could be separately controlled and terminated as an integrated circuit. More practically, groups of cells can be connected to each other within each group for the source and gate connections, all having a common drain.

Having a common drain gives one terminal where the current can be continuous, reducing the consequences of packaging inductance and the skin effect. If a number of source connections are used and they are interdigitated, there will be a degree of coupling between the source leads, reducing the effects of parasitic inductance there as well.

DETAILED DESCRIPTION

Figures 1, 2:
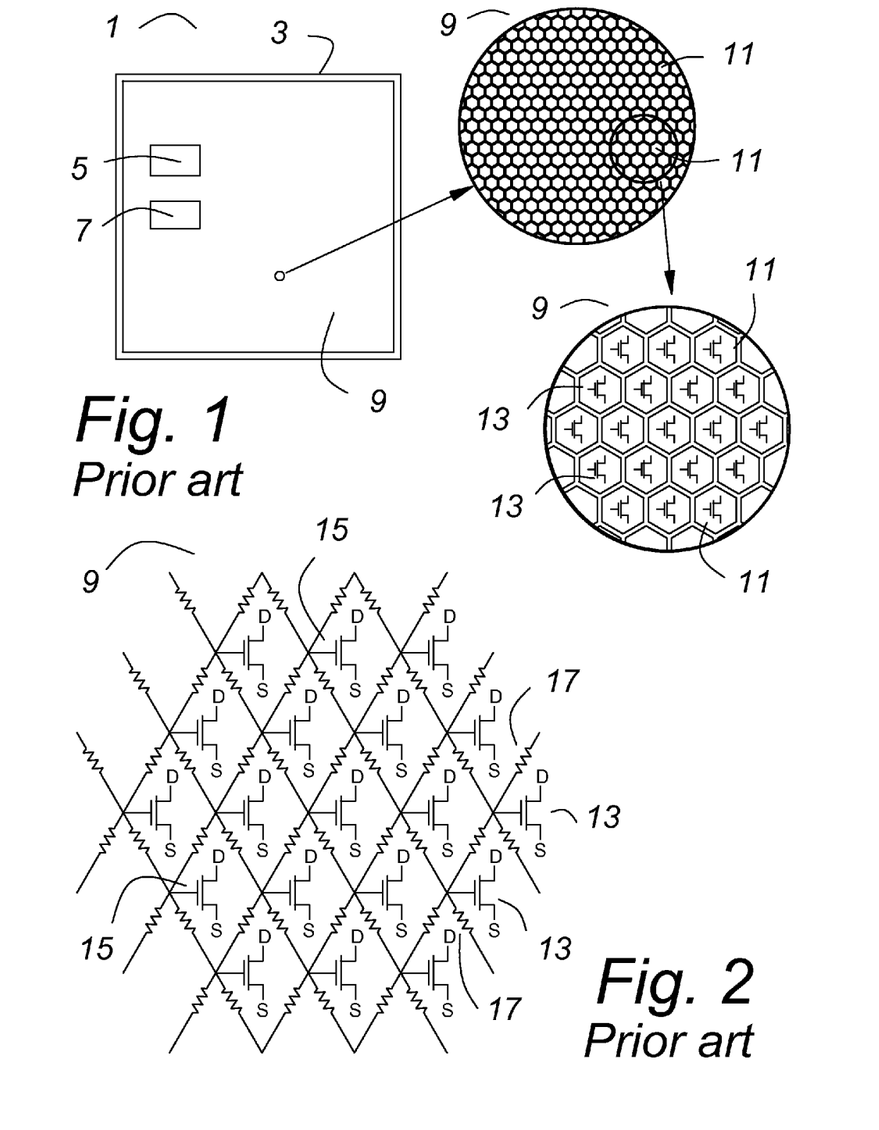
FIG. 1 shows a prior art MOSFET with successively enlarged segments showing that a MOSFET comprises a very large number of MOSFET cells.
FIG. 2 shows the gate mesh connecting the cells of a prior art MOSFET.

FIG. 1 shows a representative prior art vertical MOSFET die 1. Usually the bottom surface 3 of the die 1 is the drain connection. There may be one or more source termination pads 5 and one or more gate termination pads 7 on the top surface. Part of the structure 9 of the MOSFET is shown in successively higher magnification showing that the MOSFET 1 comprises a very large number of cells 11-11 each of which can be represented as a separate very small MOSFET 13-13, each with its own gate, insulation layer and channel. The channel comprises a drain and a source. The drains of all of the cells are common in the common drain substrate. The sources of all of the channels are connected in a common source connection, usually a metalization on the top of the MOSFET die. The gates of all of the cells are also connected in a common gate connection, usually a polycrystalline layer. The polycrystalline gate has a fairly high distributed resistance.

Some MOSFET structures are truly cellular while in others, the cells 11-11 are not as distinct, but in all the cells 11-11 can be isolated through the design of the diffusion masks and metalization. However, all have a common drain connection 3 through the bulk silicon into which the MOSFET 1 is diffused.

The MOSFET 1 is usually bonded to a metal carrier or package, not shown, as by conductive adhesive, solder or braze. The drain connection is from the bottom surface 3 of the MOSFET die 1 to the plain metal surface of the carrier or package. This means that as the current through the MOSFET is switched, conduction must be established into the plane of the metal conductor perpendicularly. For dc or low frequency ac, this is not a problem, but with very high di/dt, high frequency effects become important, particularly the skin effect (penetration depth). The current cannot penetrate instantly into the bulk of the metal, so initially conduction is constrained to the surface of the metal. The current will crowd to the periphery of the MOSFET die.

FIG. 2 shows the gate mesh of a representative prior art MOSFET die as a network of resistors 17-17 shown connecting the gates 15-15 of the representative MOSFETs 13-13 in a common gate connection.

Figure 3:
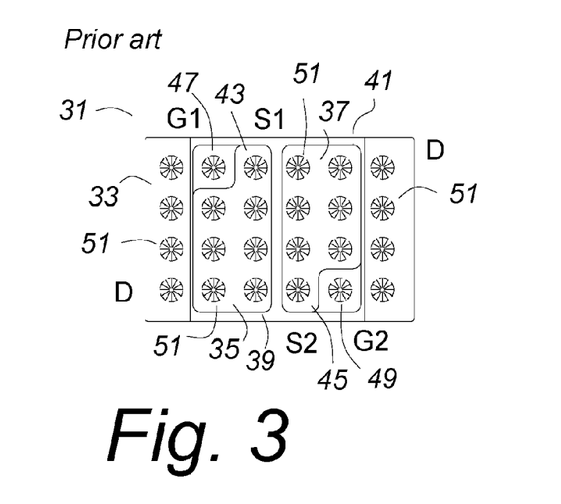
FIG. 3 shows a prior art dual source MOSFET package, with two MOSFET dice with a common drain connection by having both dice bonded to a common metal carrier.

FIG. 3 shows a prior art dual MOSFET 31 comprising a carrier 33. Within the carrier 33 there are first and second MOSFET dice 35 and 37, having, respectively, first and second sources 43 and 45 and first and second gates 47 and 49. The respective first and second drains 39 and 41 are the bottoms of the MOSFET dice 37 and 39 and are electrically connected to the carrier 33. A plurality of solder bumps 51-51 can provide means for connection to a circuit.

The dual MOSFETs as shown in FIG. 3 are usually used for power switching, perhaps in cellular telephones, as a protection against reverse polarity, as an example, not a limitation. Being essentially a dc application, high frequency effects are not of consequence.

Figure 4:
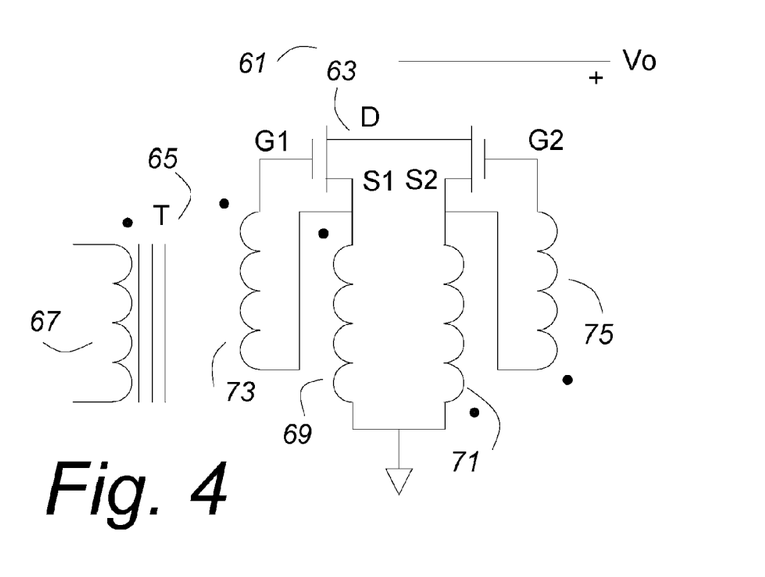
FIG. 4 shows a transformer connection for driving a dual source MOSFET.

FIG. 4 shows a synchronous rectifier circuit 61 comprising a dual source MOSFET 63 of this invention connected to a transformer 65. The transformer 65 comprises a primary winding 67, a push pull secondary comprising two windings 69 and 71 connected, respectively, to the first and second sources S1 and S2 of the dual source MOSFET 63. Additional windings 73 and 75 provide a gate drive voltage for the first and second gates G1 and G2 of the dual source MOSFET 63. The MOSFET drive scheme is shown as an example, not a limitation, as there are many ways to drive the MOSFET.

Assuming that the dual source MOSFET 63 is an n-channel MOSFET, as an illustration, not a limitation, a positive voltage with respect to its source S1 or S2 must be applied to each gate G1 or G2 to turn on the respective source S1 or S2. The primary winding 67 of the transformer 65 may be excited by a square wave or pulse width modulated excitation of alternating polarity. This will excite alternate positive and negative voltages in the secondary windings 69 to 73 according to the phasing as indicated by the well known dot convention. When the dot end of the secondary winding 69 is positive, the dot end of the additional winding 73 will be positive as well with a higher potential. The same relationship exists for the secondary winding 71 and the additional winding 75 with respect to their respective non-dot ends.

Synchronous rectifier circuits using MOSFETs usually use a common source connection, see FIG. 9 below with the individual drain terminations connected to the transformer windings. The center-tap is then the positive output. With a common drain connection, the dual source MOSFETs of this invention, such as the dual source MOSFET 63 of FIG. 4, must necessarily employ the common drain connection as the positive output (if N-channel, it is the negative output if P-channel). The source connections S1 and S2 connect to the transformer, and the center-tap of the transformer is the common return.

It is the nature of MOSFETs that the gate must be driven with respect to the source, and the same is true for each side of the dual source MOSFET of this invention. As the additional windings 73 and 75 connect from the respective sources S1 and S2 to the respective gates G1 and G2, and as they have the correct polarity as shown by the phasing dots, that criterion is met for the circuit 61 of FIG. 4 (given that the voltage levels are correct). One skilled in the art of power converters would know how to determine and design for the correct voltage levels, timing and polarity.

Figures 5, 6:
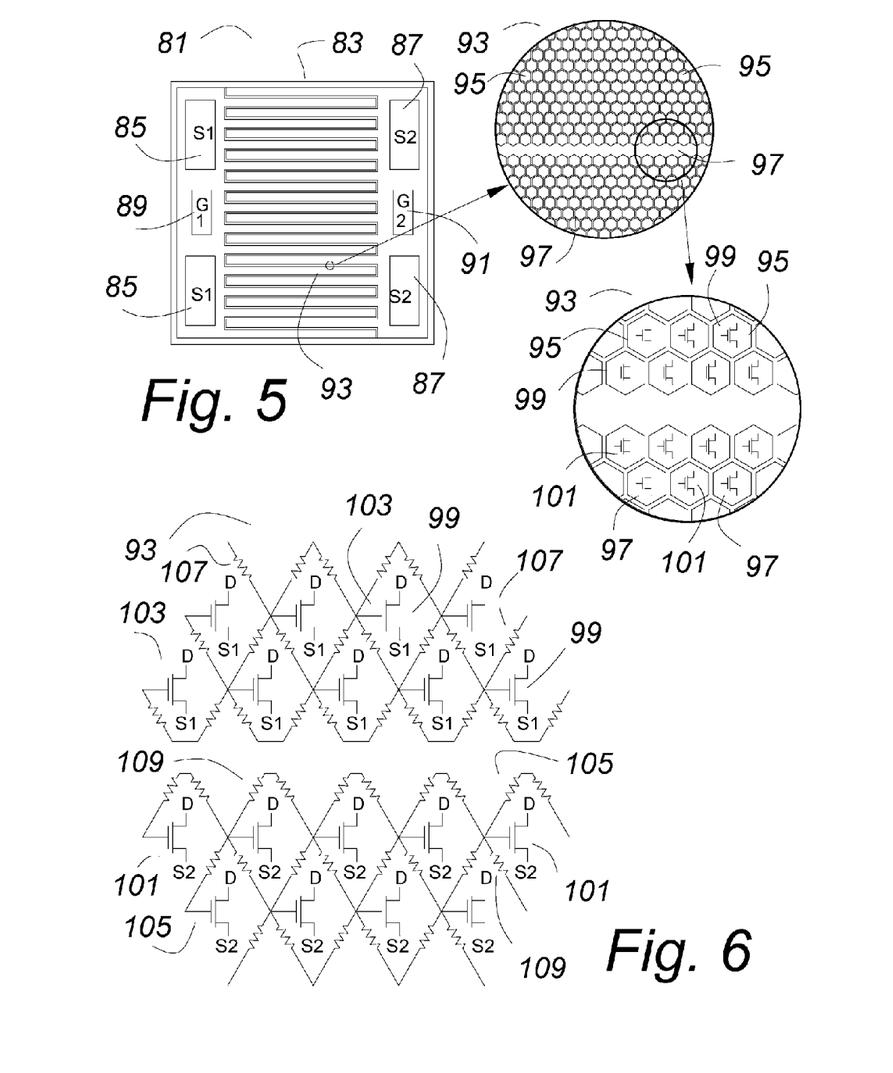
FIG. 5 shows a dual source MOSFET die of this invention with successively enlarged segments showing that the dual source MOSFET comprises a very large number of MOSFET cells arranged in two groups having a common drain connection.
FIG. 6 shows how the gate mesh is divided to separately drive the groups of MOSFET cells.

FIGS. 5 and 6 show a dual source MOSFET die 81 of this invention. The bottom surface of the die 83 comprises a common drain connection. The cell structure 93 of the die 83 is represented in successive magnifications showing that the MOSFET comprises a very large number of cells 95-95 and 97-97, which can be represented as individual MOSFETs 99-99, and 101-101, each with its own gate, insulation layer and channel. The cells 95-95 and 97-97 are separated into two groups. The channels each comprises a drain and a source. The drains of all of the cells are common in the common drain substrate. The sources of all of the channels with each group are connected in first and second common source connections, which may be metalization on the top of the MOSFET die. The gates of all of the cells within each group are also connected in first and second common gate connections, usually a polycrystalline layer. The polycrystalline gate has a fairly high distributed resistance.

The cells 95-95 and 97-97 are separated into two regions. A first region comprises first cells 95-95 comprising first MOSFETs 99-99 having sources S1-S1 terminated in first source termination pads 85, 85 and having first gates 103-103 connected through a first gate mesh represented by resistors 107-107 terminated in a first gate pad 89. A second region comprises second MOSFETs 101-101 having second sources S2-S2 terminated in second source termination pads 87, 87 and having second gates G2-G2 connected through a second gate mesh represented by resistors 109-109 terminated to the first gate pad 91.

A MOSFET die comprises a very large number of cells, perhaps millions. In theory, each could be individually controlled as a very complex integrated circuit. In a practical device for synchronous rectifying and other similar applications, it is straightforward to divide the cells into two (or more) groups and terminate their sources and gates separately with little loss of useable die area. With some MOSFET technologies, it would be possible to separate and separately terminate drain regions as well, but with greatly increased die area, complexity and a sacrifice in the on resistance.

In FIG. 5, it can be seen that the source metalization is interdigitated. The limitations of drawing clearly limits the number of conductor stripes that can be drawn, but it is contemplated that the interdigitation would be much more dense than can be illustrated, particularly for a low voltage device.

To describe representative power converter operation, with reference to FIG. 4, current will flow alternately from secondary windings 69 and 71 respectively into the sources S1 and S2. Suitable control circuitry, shown as an illustration, not a limitation, as additional windings 73 and 75, will turn on either G1 or G2, as appropriate to the phase of the excitation of the transformer 65 so that a continuous current will flow out of the drain D. In "100%" duty cycle operation, the currents alternate. In PWM operation, a different control method may be preferred, and the currents alternate during the "on" times and divide between S1 and S2 during the "off" times. Regardless, with any degree of inductance in the external circuitry, a continuous current will flow from the drain, and the sum of the currents flowing into the sources will be essentially equal to the drain current and will be constant over short intervals of time. As it is contemplated to use fast switching, the current will not vary much during the switching time.

Very fast switching circuits as described in a co-pending U.S. patent application Ser. No. 10/707,774, entitled "Gate Drive Method and Apparatus for Reducing Losses in the Switching of MOSFETSs", filed Jan. 12, 2004, may be incorporated into the dual source MOSFET. This application is owned by the same entity as the present invention, and is incorporated herein by reference. This invention contemplates using very fast switching circuits as described therein, but they are not shown because it would make the drawings unduly complex and because their use is discretionary, as a circuit tradeoff during design. When a dual source MOSFET is recited in this specification and the claims, it may or may not include logic circuits and/or gate drive circuits. For the purpose of the present invention, it is equivalent whether the logic and drive is embedded or remote.

In a synchronous rectifier circuit comprising two separate MOSFETs, the current must overcome the package inductances, building in one and decaying in the other according to the voltages present and the package inductance. In the dual source MOSFET of this invention, the drain package inductance is common, thus it promotes continuous current flow rather than impeding it. It is further contemplated that the source leads are routed to have mutual inductance, and the mutual inductance will promote continuous current as well rather than impeding it.

Figure 7:
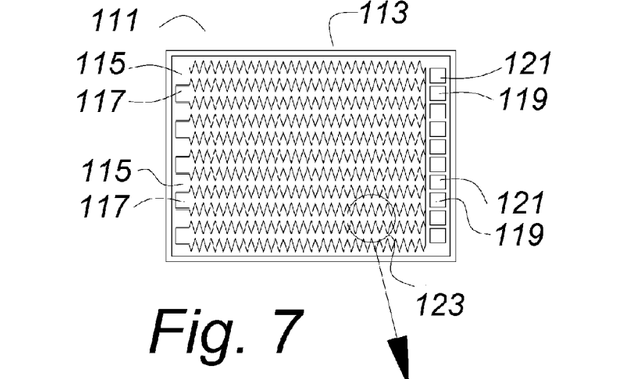
FIGS. 7 and 8 show a MOSFET die having ten separate, highly interdigitated source groups with ten gates. It is contemplated that this MOSFET would be used as an interdigitated dual source MOSFET by connecting alternate source connections in parallel.
Figure 8:
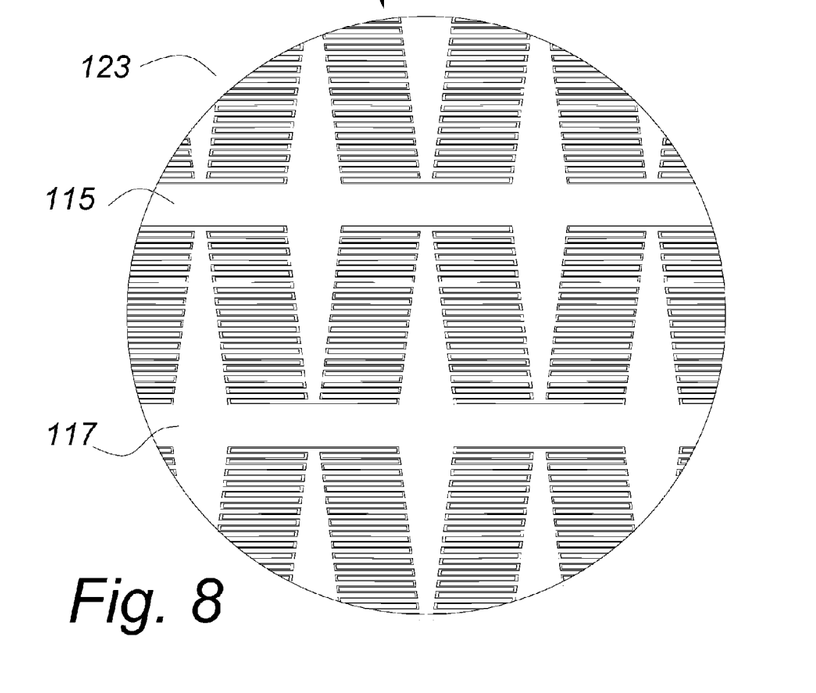

FIGS. 7 and 8 show a dual source MOSFET die 111 of this invention having even greater interdigitation between the common first and second source connections of it sources 115-115 and 117-117. The sources 115-115 and 117-117 being in a row facilitates interdigitated or interleaved connections, on the left. A common drain 113 is the bottom of the MOSFET die 111. Gates 119-119 and 121-121 are terminated on the right. The source structure 123 is shown magnified in FIG. 8, showing that the interdigitated sources 115-115 and 117-117 are further interdigitated at their boundaries, but even so, it is contemplated that the interdigitation is much more dense than can be drawn in a figure. Ten source regions are shown, it being contemplated that in a practical MOSFET there may be many more. Alternate source regions and their corresponding gate regions are grouped as two sources to comprise the dual source MOSFET. It is further contemplated that there would be many external connections for the sources and gates, so that the conductors leading to them may be interdigitated or interleaved for minimum parasitic inductance.

A dual source MOSFET may be packaged and terminated in a variety of ways, as would be well known to one skilled in the art. A preferred method is the use of solder balls or bumps distributed over the surface of the dual source MOSFET, as it provides a good, low inductance interconnection with good opportunities to use interdigitation or interleaving in the circuit with which it connects. If the dual source MOSFET is packaged in a leaded package, it is preferred to use a large number of leads for the first and second sources, and preferably the leads alternate to promote interdigitation and/or interleaving of the source conductors in the circuit to which it is connected.

As the current flows from a source to the drain connection, there will be current spreading due to the resistivity of the bulk material of the substrate. It is contemplated that the density of the interdigitation of the sources will be such that the spreading regions mostly overlap so that at the silicon to metal interface, there will be a constant current everywhere regardless of which source that it originates from.

In this specification and the claims, "dense" and "densely", as applied to the interdigitation of the common first and second source connections means that the respective source metalizations are closely enough spaced so that the current at the silicon to metal interface at the bottom of the die has spread sufficiently so as to obscure from which source the current originates, that is, so that there is no significant difference in the current density and distribution if one source is on (conducting) or the other source is on, or both are on and sharing the current. In switching from one source to the other, if the sum of the source currents is held constant, there will be no significant change in the current density or distribution over the silicon to metal interface at the common drain connection as a consequence of the switching.

Figure 9:
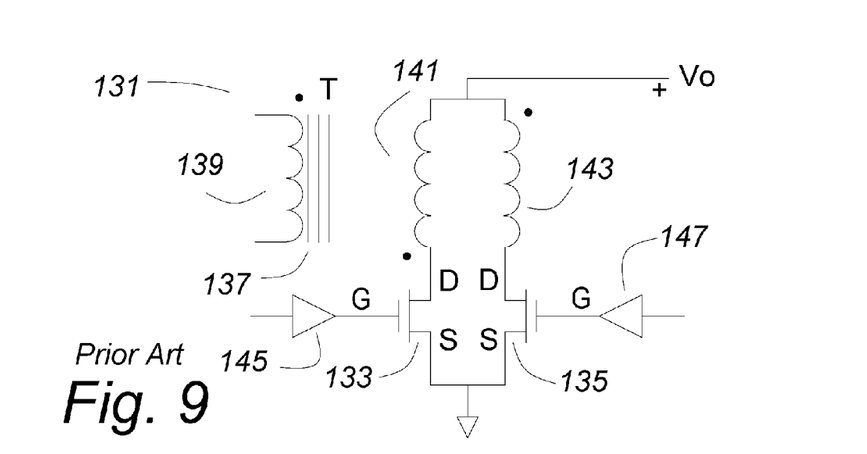
FIG. 9 shows a prior art synchronous rectifier circuit.

FIG. 9 shows a representative prior art synchronous rectifier circuit 131 comprising two MOSFETs 133 and 135 with their drains D, D connected to secondary windings 141 and 143 of a transformer 137. A primary winding 139 provides excitation to the transformer 137 and the center-tap of the secondary windings 141 and 143 is the positive output. The common source connection S, S of the MOSFETs 133 and 135 is the return. Drivers 145 and 145 control the gates G, G of the MOSFETs 133 and 135.

Figure 10:
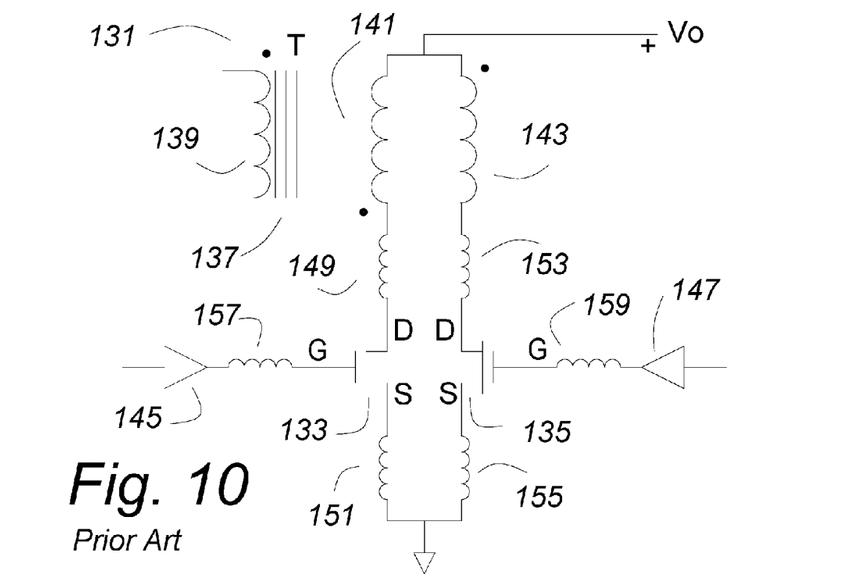
FIG. 10 shows the same circuit with some of the parasitic inductances illustrated.

FIG. 10 shows the same circuit 131 as in FIG. 9, but with parasitic inductances 149-159 shown. These are not separate components, but represent the parasitic inductance of the package leads and internal connections as well as traces and wires in the circuit to which the MOSFETs 133 and 135 are connected.

While the inductances impede the high frequency operation of the circuit 131, there is another high frequency effect that can also be represented by the parasitic inductances 149-159, and that is the so called "penetration depth" or "apparent resistance" of conductors at high frequency. It is the imaginary component of the inductances, and is lossy. Essentially, if a current is built up or decreased in a conductor, eddy currents in the surface of the conductor resist the change. While increasing a current from zero, these eddy currents confine the current to a shallow surface region of the conductor. While decreasing a current to zero, the eddy currents cause a persistent sub-surface current to continue to flow. While these eddy currents decay quite rapidly due to losses, they are significant at high frequencies.

In a MOSFET package, the drain current flows through the MOSFET die into the package, essentially a current flowing into a plane surface. If the current is switched on and off at a high frequency, the high frequency effects will limit conduction on turn on to a shallow depth in the surface, and current flow into the center will be greatly limited. If the current into the drain is continuous, this effect is eliminated. It is an objective of this invention to teach a dual source MOSFET die in which the current reaching the drain conductor is essentially constant. Preferably the sources are sufficiently interdigitated that the currents from the respective sources will merge in the drain region so as to be unvarying at the metallic interface, and avoiding high frequency effects entirely in the drain termination and all leads and interconnections to it.

Figure 16:
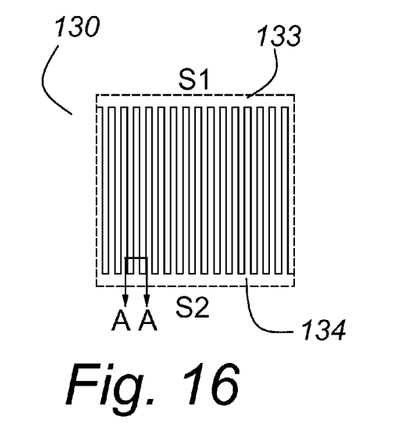
FIG. 16 shows a diagrammatic view of a smaller segment of the surface of the integrated synchronous rectifier of FIG. 8, showing interdigitated first and second source connections. A practical device has very fine pitch features, far finer than can ever be drawn, so this diagrammatic view is suggestive, not literal.

FIG. 16 shows a diagrammatic representation of smaller segment of the dual source MOSFET of FIG. 8. In FIG. 16, the source regions 133 and 134 are shown as interdigitated regions, terminated at first and second source terminations, S1 and S2. The gates cannot be seen, as they are under the metallization of the source regions 133 and 134. A practical MOSFET has very fine features, much too fine to be drawn, so FIG. 16 and others like it must be interpreted as being suggestive, not literal.

Figure 17:
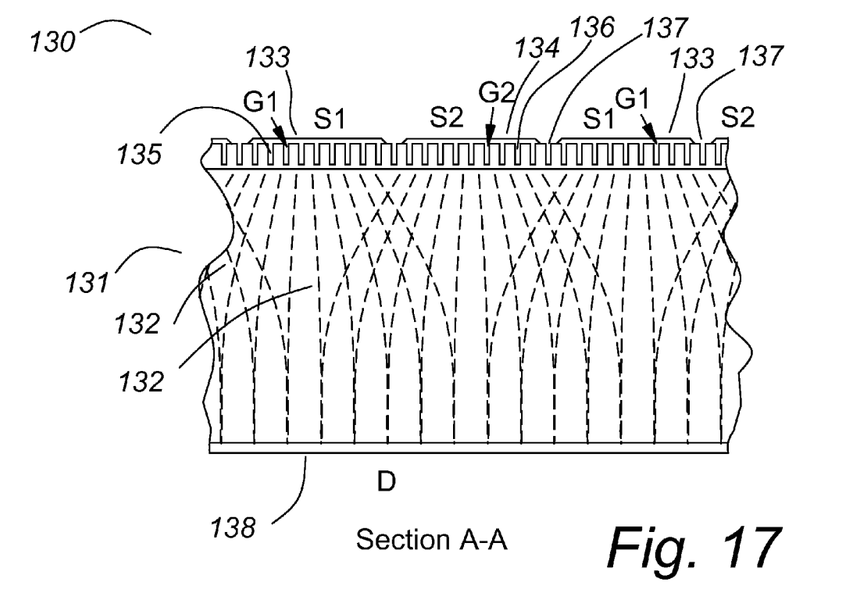
FIG. 17 shows an enlarged section A-A of the integrated synchronous rectifier of FIG. 16.

FIG. 17 shows a section A-A of the dual source MOSFET 130 of FIG. 16. A silicon substrate 131 has top surface into which a number of trenches have been etched. Most of the trenches are gate regions for a first gate 135 or a second gate 136, but a few are used as insulation spaces 137. The top surface also has first and second sources 133 and 134, and the bottom of the substrate is the drain terminal 138. It is contemplated that the pitch of the sources 133 and 134 is small and that the currents 132-132 will spread so that the current density at the drain 138 will be comparable regardless of which source 133 or 134 is turned on in a synchronous rectifier circuit.

Figure 11:
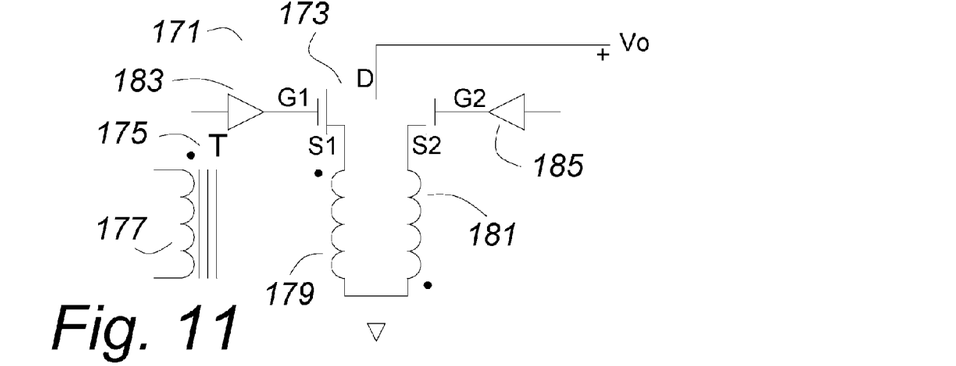
FIG. 11 shows a synchronous rectifier using a dual source MOSFET with a transformer.

FIG. 11 shows a synchronous rectifier circuit 171 comprising a dual source MOSFET 173 of this invention with its first and second sources S1 and S2 connected respectively to secondary windings 179 and 181 of a transformer 175. A primary winding 177 provides alternating excitation to the transformer 175, and the center-tap of the windings 179 and 181 is the common return. The common drain D of the dual source MOSFET 173 is the positive output of the synchronous rectifier circuit 171. Gate drivers 183 and 185 drive the gates G1 and G2 of the dual source MOSFET 173.

Figure 12:
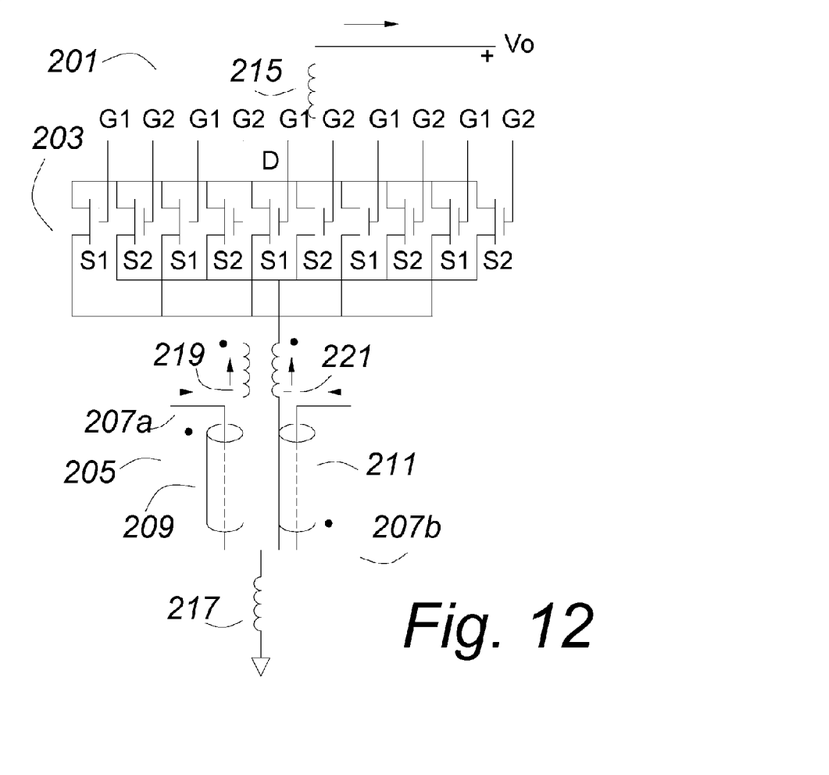
FIG. 12 shows the circuit of FIG. 11 (less the drivers) using the MOSFET of FIG. 7 with a cellular transformer module. Parasitic inductances are shown as well.

FIG. 12 shows a synchronous rectifier circuit 201 comprising a dual source MOSFET 203 (which may be the dual source MOSFET 111 of FIGS. 8 and 9) with its first and second sources S1 and S2 connected respectively to the secondary windings 209 and 211 of a cellular transformer 205 through parasitic inductances 219 and 221. A primary winding 207a and 207b excites the transformer 205. The center-tap of the secondary windings 209 and 211 is the common return, shown connected through a parasitic inductance 217. The common drain of the dual source MOSFET 203 is the positive output of the synchronous rectifier circuit 201, shown connected through a parasitic inductance 215.

For many power converter circuits, the parasitic inductances 215 and 217 would carry a continuous current, so these parasitic inductances facilitate the operation of the circuit rather than impede it. In fact, one or both could supplement inductive components of a practical filter circuit. High frequency switched current flows through the parasitic inductors 219 and 221, so it is preferred to minimize these inductances. If they cannot be sufficiently minimized, it is preferred that their mutual inductance be enhanced as much as practical such as by using interdigitated or interleaved conductors.

Though called a dual source MOSFET, the dual source MOSFET 203 is shown with ten sources and ten gates, as does the dual source MOSFET die 111 of FIGS. 7 and 8. It is contemplated that there may actually be many more source regions than ten, as showing only ten is a limitation of what can be drawn in a figure and is not a limitation of the invention. It is further contemplated that this device would be wired with a plurality of interdigitated source connections so that the first sources, controlled by the first gates are effectively a first source S1 controlled by a first gate G1 and the remaining second sources, controlled by the remaining second gates are effectively a second source S2 controlled by a second gate G2. Practical devices could have any number of sources and gates given present high density packaging techniques that are available.

Figures 13, 14:
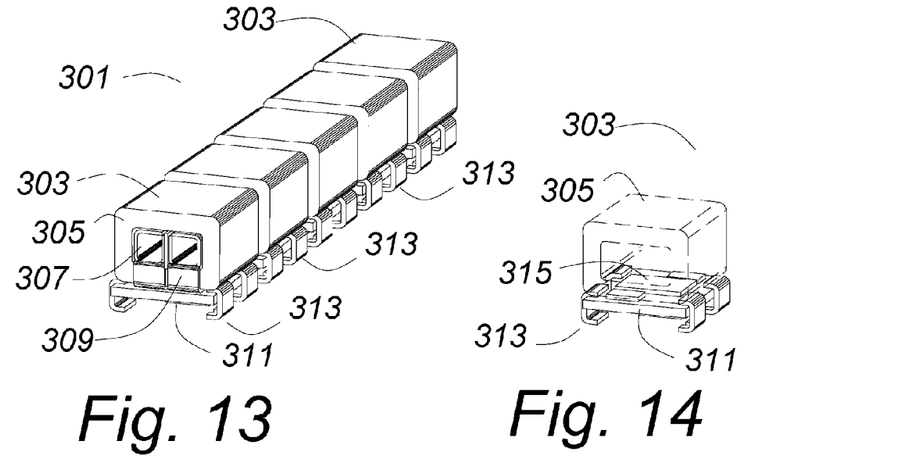
FIG. 13 shows a portion of a representative cellular transformer comprising five modules. The primary winding is installed through the aligned through holes.
FIG. 14 shows one module of a cellular transformer with the transformer core in phantom so that the dual source MOSFET die can be seen on the circuit board.

It is contemplated that the dual source MOSFET of this invention may be used in modules of a cellular transformer, as an illustration, not a limitation. FIG. 13 shows a portion of a cellular transformer 301 comprising a plurality of modules 303-303. The modules 303-303 comprise a magnetic core 305, secondary windings 307 and 309 which are terminated on a circuit board 311. The module is terminated by a plurality of terminals 313-313.

FIG. 14 shows one of the modules 303 of FIG. 13 with the magnetic core 305 shown in phantom so that the MOSFET die 315 of this invention can be seen on the circuit board 311. It is preferred that the transformer and its synchronous rectifiers be tightly packaged and optimally connected for low inductance.

Figure 15:
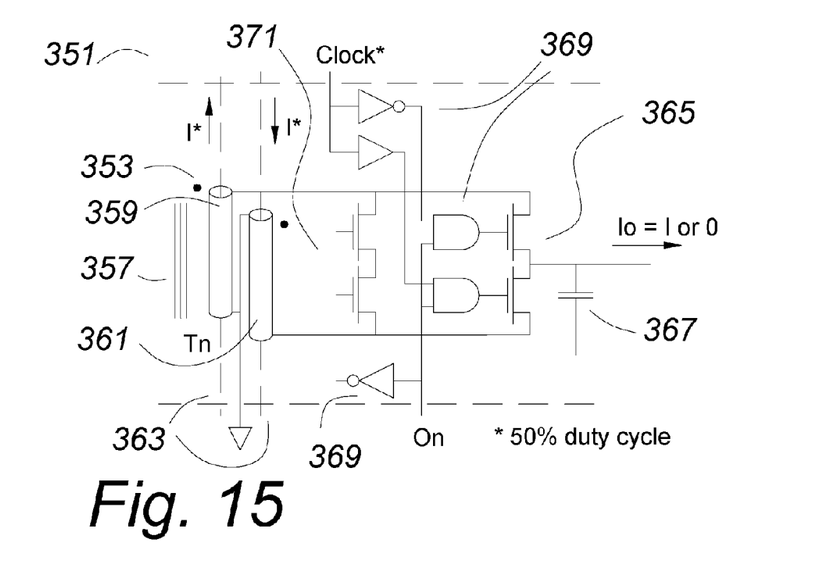
FIG. 15 shows a schematic diagram of a representative cellular transformer module as might be used in a switched current power converter.

FIG. 15 shows a representative schematic diagram of a cellular transformer module 351 used in a switched current power converter. The operation of this cellular transformer module 351 and the switched current power converter are taught in a co-pending U.S. provisional patent application Ser. No. 60/593,110 entitled "Switched Current Power Converters", and filed Dec. 10, 2004. This provisional application is owned by the same entity as the present invention, and it is incorporated herein by reference.

A cellular transformer 353 comprises a magnetic core 357 and two secondary windings 359 and 361. A primary winding 363 is shown in dashed lines because it is not a part of the module 351 but is installed later in final assembly. The primary winding 363 may excite the cellular transformer with a square wave having a constant current, as an illustration, not a limitation. A first dual source MOSFET 365 of this invention functions as a synchronous rectifier as explained above in this specification, responsive to a "clock" input when a control input "on" is high. Logic 369-369 steers and controls the function of the module 351 and provides gate drives for the gates.

Note, however, that the first dual source MOSFET 365 may be turned off when the "on" input is low, effectively switching off the output current "Io". So as to not reflect high impedance to the primary winding 363 of the cellular transformer 353, a second dual source MOSFET 371 is turned on whenever the synchronous rectifier (the first MOSFET 365) is turned off. This presents a short circuit to the secondary windings 359 and 361 of the cellular transformer 353. This illustrates another use for the dual source MOSFETs of this invention.

In this example, the dual source MOSFET 371 is functioning as an ac switch, much as the dual source MOSFET 31 of FIG. 3. However, there is no connection needed to the drain. It is contemplated that the MOSFET 371 would have highly interdigitated source metalization, as in the dual source MOSFET 111 of FIG. 7. However, where as the function of the dense interdigitation taught above was to diffuse the current density at the silicon to metal interface at the drain connection, it also serves to provide a very wide channel for very low impedance from the first source to the second source when both sources are turned on. Further the highly interdigitated sources and the contemplated terminations allow for interdigitated or interleaved conductors in the circuit to which it is connected, for minimum leakage inductance therein. In as much as the currents must change direction very rapidly, this is very important.

Thus the same construction that makes an improved synchronous rectifier also makes an improved ac switch for high frequency currents, although no drain connection is needed.

For this specification and the claims, "highly interdigitated" means that the sources are sufficiently interdigitated that the currents from the respective sources will merge in the drain region so as to be essentially unvarying at the metallic interface regardless of which source is conducting.

What is claimed is:

1. A dual source metal oxide silicon field effect transistor comprising
a plurality of cells, each of the plurality of cells comprising a gate, and insulation layer, and a channel,
the channel comprising a source and a drain,
the plurality of cells being diffused into a common drain substrate having a common drain connection for connecting all of the drains of the
plurality of cells to an external power circuit,
the plurality of cells being divided into a first group of cells having
a common first source connection connecting together all of the sources of the first group of cells and having
a common first gate connection connecting together all of the gates of the first group of cells
and a second group of cells having
a common second source connection connecting together all of the sources of the second group of cells and having
a common second gate connection connecting together all of the gates of the second group of cells,
the number of cells in the first group of cells being essentially equal to the number of cells in the second group of cells,
the common first source connection and the common second source connection being for connecting respectively to the external power circuit, the common first gate connection and the common second gate connection being for connecting respectively to first and second control and gate drive circuits, and
the common first source connection and the common second source connection being highly interdigitated.

2. A dual source metal oxide silicon field effect transistor for synchronous rectifying comprising
a plurality of cells, each of the plurality of cells comprising a gate, and insulation layer, and a channel, the channel comprising a source and a drain,
the plurality of cells being diffused into a common drain substrate having a common drain connection for connecting all of the drains of the plurality of cells to an external power circuit,
the plurality of cells being divided into a first group of cells having
a common first source connection connecting together all of the sources of the first group of cells and having
a common first gate connection connecting together all of the gates of the first group of cells and
a second group of cells having a common second source connection connecting together all of the sources of the second group of cells and having
a common second gate connection connecting together all of the gates of the second group of cells,
the number of cells in the first group of cells being essentially equal to the number of cells in the second group of cells,
the common first source connection and the common second source connection being for connecting respectively to the external power circuit, the common first gate connection and the common second gate connection being for connecting respectively to first and second control and gate drive circuits, and
the common first source connection and the common second source connection being highly interdigitated.

3. A dual source metal oxide silicon field effect transistor for switching an ac current comprising
a plurality of cells, each of the plurality of cells comprising a gate, and insulation layer, and a channel, the channel comprising a source and a drain,
the plurality of cells being diffused into a common drain substrate having
a common drain connection for connecting together all of the drains of the plurality of cells,
the plurality of cells being divided into a first group of cells having a common first source connection connecting together all of the sources of the first group of cells and having
a common first gate connection connecting together all of the gates of the first group of cells
and a second group of cells having a
common second source connection connecting together all of the sources of the second group of cells and having
a common second gate connection connecting together all of the gates of the second group of cells,
the number of cells in the first group of cells being essentially equal to the number of cells in the second group of cells,
the common first source connection and the common second source connection being for connecting respectively to an external power circuit, the common first gate connection and the common second gate connection being for connecting respectively to first and second control and gate drive circuits, and
the common first source connection and the common second source connection being highly interdigitated.

* * * * *